US007636876B1

United States Patent
Srinivasan et al.

(10) Patent No.: US 7,636,876 B1
(45) Date of Patent: Dec. 22, 2009

(54) COST-BASED PERFORMANCE DRIVEN LEGALIZATION TECHNIQUE FOR PLACEMENT IN LOGIC DESIGNS

(75) Inventors: Sankaranarayanan Srinivasan, San Jose, CA (US); Srinivasan Dasasathyan, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 346 days.

(21) Appl. No.: 11/405,902

(22) Filed: Apr. 18, 2006

(51) Int. Cl.
  *G01R 31/28* (2006.01)
  *G06F 11/00* (2006.01)
  *G06F 17/50* (2006.01)
(52) U.S. Cl. .................. 714/724; 714/701; 716/4; 716/11
(58) Field of Classification Search ............ 714/724, 714/726, 799, 723, 700, 2; 716/4, 10, 11
  See application file for complete search history.

(56) References Cited

U.S. PATENT DOCUMENTS 6,813,754 B2 * 11/2004 Wu et al. .................. 716/10
7,275,228 B1 * 9/2007 Padalia et al. ............. 716/10

OTHER PUBLICATIONS

Sung-Woo Hur et al.; "Mongrel: Hybrid Techniques for Standard Cell Placement"; Copyright 2000 IEEE; International Conference on Computer-Aided Design; pp. 165-170.

Anmol mathur et al.; "Compression-Relaxation: A New Approach to Performance Driven Placement for Regular Architectures"; Copyright 1994; Procedures International Conference On Computer Aided Design; pp. 130-136.

Larry McMurchie et al.; "PathFinder: A Negotiation-Based Performance-Driven Router for FPGAs"; Proceedings of the Third International ACM Symposium on Field-Programmable Gate Arrays (FPGA'95); Feb. 1995; pp. 1-7.

Moazzem Hossain et al.; "A New Faster Algorithm for Iterative Placement Improvement"; Copyright 1996 IEEE; pp. 44-49.

Hans Eisenmann et al.; "Generic Global Placement and Floorplanning"; Copyright 1998; ACM/IEEE DAC; pp. 269-274.

* cited by examiner

*Primary Examiner*—Phung M Chung

(74) *Attorney, Agent, or Firm*—Kevin T. Cuenot; Michael R. Hardaway

(57) ABSTRACT

A method of placing a circuit design can include selecting one or more candidate mobile nodes from a plurality of overlapped nodes of the circuit design and determining a gain region for each candidate mobile node. The method also can include assigning the candidate mobile node to a site within a gain region according to a cost function. The gain region is associated with the candidate mobile node. The method further can include iteratively selecting and assigning candidate mobile nodes according to a measure of overlap for the circuit design.

20 Claims, 1 Drawing Sheet

COST-BASED PERFORMANCE DRIVEN LEGALIZATION TECHNIQUE FOR PLACEMENT IN LOGIC DESIGNS

BACKGROUND

1. Field of the Invention

The present invention relates to the field of circuit design and, more particularly, to deriving a legal placement for a circuit design.

2. Description of the Related Art

One important task in the process of implementing a circuit design from a hardware description language (HDL), such as VHDL® or Verilog®, is placement. Placement refers to the process of assigning coordinate locations from an abstract grid representation of a particular target device, such as a programmable logic device (PLD), to various blocks and pins of the circuit design. The objective of placement is to assign locations such that signals linking the blocks and pins can be routed using minimal resources and/or meet established timing requirements.

Before the circuit design can be placed, the circuit design is mapped. A PLD such as Field Programmable Gate Array (FPGA), for example, can include an assortment of different component types such as memories, central processing units, and the like. Increasingly, logic blocks, or blocks, have been introduced into these devices to enhance application specific performance. When implementing a circuit design for a particular PLD, or target device, behavioral HDL must be mapped onto logic blocks of the target device. In illustration, Xilinx, Inc. of San Jose, Calif. manufactures various PLDs such as the Xilinx® Virtex4 family of FPGAs. These devices provide a plurality of different configurable logic blocks as described above. To implement the HDL circuit design, the HDL must be mapped onto the available blocks of the target device. Thus, if using a Xilinx® Virtex4 FPGA, the HDL must be mapped onto blocks available within, or upon, the selected Virtex4 FPGA.

The mapped circuit design then can be placed. Placement techniques largely are classified as either global or detailed. Generally, global placement produces a placed circuit design that includes overlaps, while detailed placement does not. An overlap refers to the situation in which more than one component has been assigned to a same site of the target device. A placement for a circuit design that includes one or more overlaps is said to be an infeasible placement in that the circuit design, in its current condition, is impossible to physically implement on the target device. In order to implement the circuit design, the overlaps must be removed.

As noted, removal of overlaps is the domain of detailed placement. Detailed placement typically operates on an initially placed circuit design, i.e. the output of a global placement algorithm or technique. Detailed placement refines the global placement to eliminate overlaps and/or otherwise improve the placement of the circuit design in accordance with established objectives. The result is a legal placement for the circuit design, i.e. one without overlaps.

Some varieties of detailed placement algorithms utilize a Breadth-First Search (BFS) technique. A BFS is a tree search algorithm commonly used for traversing a tree structure or graph. The BFS begins at the root node and explores all neighboring nodes. For each of the nearest nodes, the BFS explores the unexplored neighbor node, and so on, until the goal of the search is reached. A BFS is considered an uninformed search method in that it expands and examines all nodes of a graph systematically in search of a solution. The BFS exhaustively searches without consideration of the end goal. No heuristics are used. With respect to detailed placement, the BFS technique will select a first available site for a given block. In consequence, any solution considered when using a BFS technique is limited by order dependence, in reference to the order in which blocks are assigned to sites.

It would be beneficial to provide a technique for detailed placement that overcomes the limitations described above.

SUMMARY

The present invention provides methods and articles of manufacture relating to producing a legal placement for a circuit design. One embodiment of the present invention can include a method of placing a circuit design. The method can include selecting one or more candidate mobile nodes from a plurality of overlapped nodes of the circuit design and determining a gain region for each candidate mobile node. A node can refer to an element within a netlist for a circuit design that can be assigned to a location on a target device. A candidate mobile node can refer to a node that is considered for relocation to another site during a given iteration of detailed placement. The candidate mobile node(s) can be assigned to a site within a gain region according to a cost function, where the gain region is associated with the candidate mobile node. In general, a gain region can define a collection of potential sites to which the associated node can be moved. The method further can include iteratively selecting and assigning candidate mobile nodes according to a measure of overlap for the circuit design.

Iteratively selecting and assigning candidate mobile nodes further can include evaluating a rate of change in the measure of overlap and selectively adjusting the gain region according to the rate of change. Iteratively selecting and assigning candidate mobile nodes also can include stopping when the measure of overlap indicates no overlap. The selection of one or more candidate mobile nodes can include selecting a node according to net-fanout, relative timing criticality, a size of a group if at least one node of the plurality of overlapped nodes is included in such a group, and/or any combination thereof. A group can refer to a structure comprising a plurality of nodes. The nodes are grouped together as a result of an explicit user constraint or are internally inferred by a tool due to device characteristics such as carry chains or wide functions. Regardless, such condition(s) necessitate the nodes being moved as a single entity during placement.

Assigning the mobile node can include determining a result of the cost function for sites within the gain region corresponding to the candidate mobile node. The cost function can depend, at least in part, upon a measure of historical congestion for a site and/or a base cost for assigning the mobile node to another site within the gain region associated with the mobile node. The cost function further can depend, at least in part, upon a penalty parameter that is imposed for sharing a site with another node. The penalty parameter and/or the measure of historical congestion can be modified using at least one increasing schedule for consecutive iterations.

Another embodiment of the present invention can include a method of placing a circuit design including selecting at least one candidate mobile node and assigning the candidate mobile node to a site within a gain region associated with the candidate mobile node in accordance with a result obtained from a cost function. The method further can include performing subsequent iterations of selecting and assigning candidate mobile nodes according to a measure of overlap for the circuit design and selectively adjusting the gain region according to a rate of change of the measure of overlap for subsequent iterations.

Selectively adjusting the gain region can include determining a rate of change in the measure of overlap from at least three consecutive iterations of selecting and assigning the candidate mobile nodes. The selection of at least one candidate mobile node can include selecting a node according to net-fanout, relative timing criticality, a size of a group if at least one node of a plurality of overlapped nodes from which the candidate mobile node is selected is included in such a group, and/or any combination thereof.

Yet another embodiment of the present invention can include a machine readable storage, having stored thereon a computer program having a plurality of code sections for causing a machine to perform the various steps and/or implement the components and/or structures disclosed herein.

BRIEF DESCRIPTION OF THE DRAWINGS

There are shown in the drawings, embodiments which are presently preferred, it being understood; however, that the invention is not limited to the precise arrangements and instrumentalities shown.

The FIG. 1 is a flow chart illustrating a method of producing a detailed placement for a circuit design in accordance with one embodiment of the present invention.

DETAILED DESCRIPTION OF THE INVENTION

Figure 1:
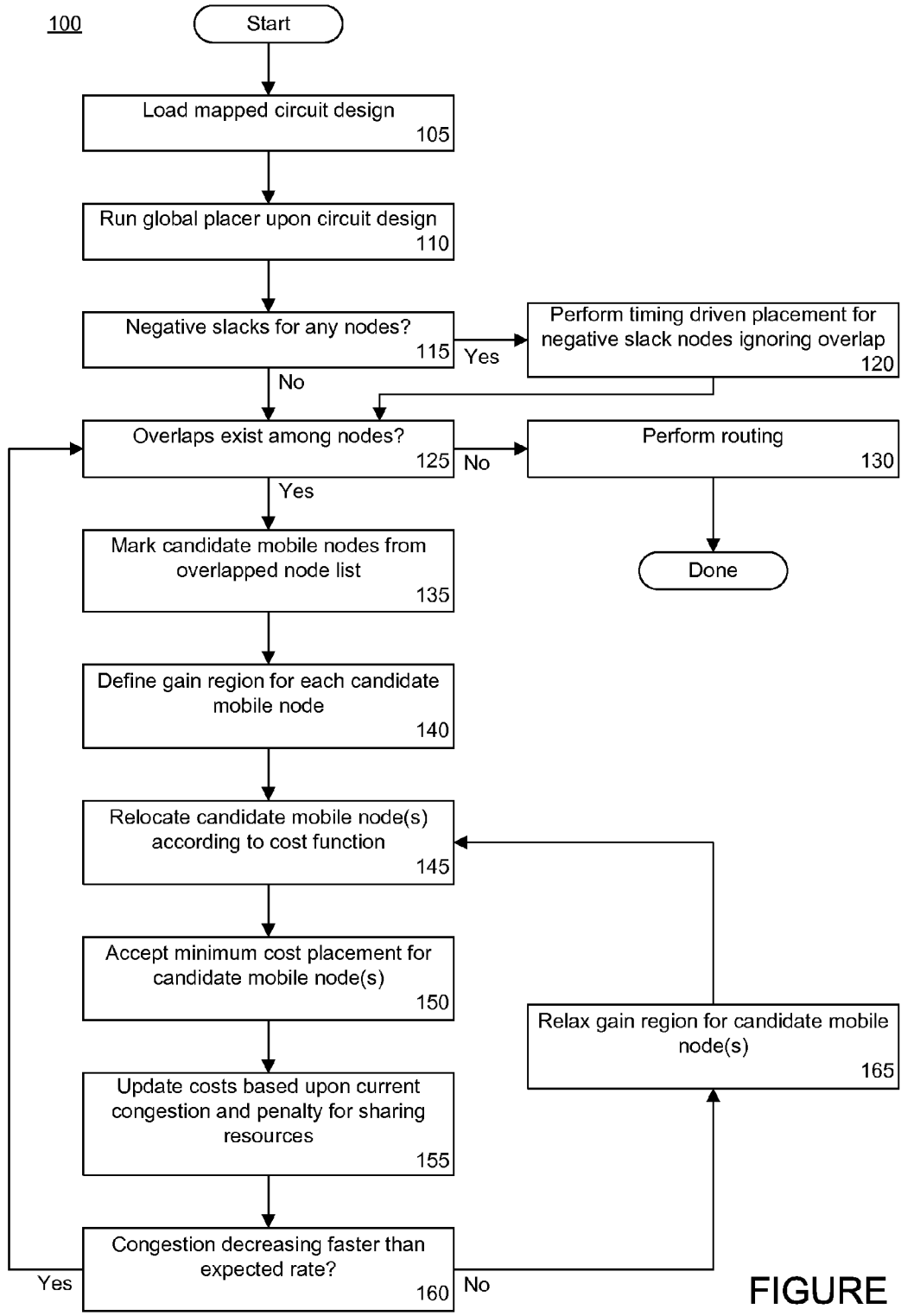

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The present invention provides a solution for producing a detailed placement for a circuit design. In accordance with the embodiments disclosed herein, various nodes of the circuit design can be selected for possible relocation. Each of the selected nodes can be moved, or re-assigned, to a site within a defined region corresponding to that node. The location, or assignment, of a particular node to a particular site can be guided by a cost function. As the process continues to iterate, an overlap removal rate can be evaluated. The overlap removal rate can be used to adjust the region(s) from which available sites are selected for a given node. Adjusting the regions in this manner facilitates the convergence to a legal solution.

The FIG. 1 presents a flow chart illustrating a method 100 of producing a detailed placement for a circuit design in accordance with one embodiment of the present invention. Method 100 can begin in a state where a circuit design has been mapped. As noted, the various hardware description language constructs can be mapped to appropriate blocks of the target device. Accordingly, in step 105, the mapped circuit design can be loaded into an electronic design automation, or other synthesis, tool.

In step 110, a global placer can be run to process the mapped circuit design. As noted, the global placer can perform an initial placement of the circuit design that may or may not be feasible. An infeasible placement typically involves some degree of overlap in reference to the assignment of more than one node to a same site. During global placement, the global placer can maintain a list of overlapping nodes.

As used herein, a contentious site can refer to a site to which more than one node has been assigned, i.e. a consequence of overlap. As noted, a node can refer to an element of a netlist whether that element is a component, a block, a collection or group of components and/or blocks, such as a relatively placed macro (RPM) of the circuit design, or the like. An RPM, for example, refers to a set of components and/or blocks, with predetermined relative coordinates among one another. The collection of components forming the RPM is moved and treated as a single, larger component.

In step 115, a determination can be made as to whether negative slacks exist for any of the nodes of the circuit design. Slack refers to the difference between the target delay of a signal path and the determined path delay. In general, the target delay is a design constraint or goal, whereas the determined delay is an estimate of the actual delay as calculated by a circuit design and/or simulation tool. Accordingly, the slack for a given path can be determined by subtracting the path delay of a path from the target delay.

A slack of zero indicates that the estimated path delay for the signal path is equivalent to the target delay. Thus, a zero slack indicates a signal path that meets established timing constraints. A positive slack indicates that the path delay for the signal path is smaller than the target delay, thereby exceeding, or propagating faster than, a timing constraint. A slack that is less than zero indicates a path having a path delay that is greater than the target delay and, therefore, does not meet an established timing constraint. The slack for a given signal path can be ascribed to a node at the start and/or end of the signal path, i.e. a source, a load, or both.

If one or more negative slacks exist, the method can continue to step 120. Else, the method can proceed to step 125. In step 120, a timing driven placement can be performed for nodes identified as having a negative slack. The timing driven placement can be performed without regard for overlap within the circuit design. Timing driven placement can relocate selected nodes to produce a placed circuit design having reduced or no negative slacks.

Detailed placement of the circuit design can begin in step 125. Accordingly, in step 125, the circuit design can be evaluated to determine whether one or more overlaps exist. If there are no overlapped nodes for the circuit design, the method can proceed to step 130 for routing. If overlapped nodes do exist, however, the method can proceed to step 135.

In step 135, one or more nodes can be selected or marked as candidate mobile nodes from the list of overlapped nodes of the circuit design. A candidate mobile node is one that is considered for relocation to another site during a given iteration of detailed placement. In one embodiment, each node located at a contentious site can be selected or marked as a candidate mobile node. This effectively marks or selects each node on the list of overlapped nodes as a candidate mobile node.

In another embodiment, nodes can be selected or marked as candidate mobile nodes in a more stringent manner that depends upon one or more heuristics. The heuristics that can be used to select the candidate mobile nodes can include, but are not limited to, net-fanout for a node, relative timing criticality of the node, a size of the group if the node is part of a collection of nodes such as an RPM, and/or the like.

In illustration, a minimum net-fanout threshold can be defined for a node to be selected. With respect to timing criticality, nodes can be selected based upon slacks, i.e. those having slacks above a particular threshold. With respect to size of group, those nodes belonging to groups of a size smaller than an established minimum threshold can be selected. Size, for example, can be measured in terms of physical area or number of nodes. In another example, the X nodes with the best slacks, the highest net-fanout, or the like can be selected.

It should be appreciated that the heuristics noted herein are provided for purposes of illustration and, as such, are not intended to be limiting. Further, each of the heuristics discussed herein can be used individually or in combination with one or more other heuristics. In any case, if the parameters of a node meet established criteria, such nodes can be selected or marked as candidate mobile nodes. The list of overlapped nodes can be evaluated using the established heuristics.

In step 140, a gain region can be defined for each of the nodes marked or selected as a candidate mobile node in step 135. A gain region defines a collection of potential sites to which the associated node can be moved. As such, a gain region is specific to the associated node. The size of the gain region for one node may be different from the size of the gain region for another node as each gain region is determined based upon the characteristics of the node to which that gain region corresponds.

In one embodiment, each gain region can be determined based upon the worst timing bound on nets connecting to the node to which the gain region corresponds. In illustration, consider that for a given PLD, a distance-delay look-up table can be constructed or determined from a timing analysis. A connection, i.e. a signal path, can be characterized by a source pin type, a load pin type, the distance between the source and load pins, as well as the delay. Distance can be measured in terms of an (x, y) coordinate system. Data can be generated for different combinations of the aforementioned parameters.

The timing bound, and thus gain region, generally provides the amount of delay increase a given connection can tolerate without violating a timing requirement associated with that connection. The timing bound also can be referred to as a slack neighborhood. In the case of a critical connection, i.e. a node having a negative slack, the slack neighborhood need not be calculated using timing heuristics. Rather, the gain region can be defined as a small, static window or region around the current location. Defining the gain region in this manner for a critical connection ensures that the placement is not disrupted too much. This further assumes that the timing-driven placement performed in step 120 is of at least a minimum quality.

For nodes having a positive slack, static timing analysis can determine a gain region within which if the node were placed, would not result in it becoming critical. The embodiments disclosed herein select candidate mobile nodes to move in a particular iteration according to timing criticality information and further consider the nodes on overlapped sites that are not critical. For instance, if nodes 1 and 2 share a site, and node 2 is less critical than node 1, node 2 can be selected to be moved while node 1 is kept on the site. If node 2 has positive slack, the distance-delay method described herein can be used to compute the gain region for node 2. If, however, node 2 has a negative slack, there is no need to use distance-delay to determine the gain region. Rather, a small, static window can be defined as the gain region surrounding node 2, or any other critical node for that matter.

With the reference table derived, given a particular source pin type, load pin type, and desired delay, a target distance between the source and load pins can be found. This distance can be used to define a window, i.e. the gain region. While the overall distance between the source and load pins may be determined through the look-up table, it should be appreciated that a variety of different (dx, dy) pairs can yield such a distance. In one embodiment, to derive a single uniform gain region, a maximum value for dx can be identified and a maximum value of dy can be identified from the plurality of (dx, dy) pairs that can be used to generate the target distance. Accordingly, the gain region can be characterized, or defined, by {Max(dx), Max(dy)} from the current location of the node.

It should be appreciated that the reference table need not be created during placement. That is, the reference table can be created outside, or prior to, the methodology described herein. For example, the reference table can be generated and stored such that it can be loaded prior to implementation of the embodiments described herein. The reference table can be generated based upon data relating to prefabricated logic and routing in field programmable gate arrays.

The creation of a window results in one window being created for each pin of a given node. If the node has multiple pins and a window is created for each connection, it likely will be the case that a plurality of windows is created for that node. Accordingly, in one embodiment, where more than one window is defined for a given node, the gain region can be defined by the intersection of the windows corresponding to that node.

While the creation of gain regions has been illustrated with respect to timing criticality and delay information, it should be appreciated that other techniques for defining a gain region can be used. In another embodiment, for example, gain regions can be defined using a metric such as power management where the movement of nodes is performed with the objective of minimizing power consumption. The gain region can be defined in such a way as to include a set of sites that are likely to minimize power consumption should the node be moved to a site within the gain region.

In another embodiment, the gain region can be defined using a metric such as routing where the use of wire resources is minimized. In still another embodiment, the gain region can be defined in a manner that minimizes congestion. Any of a variety of different metrics can be used to define the gain region and, as such, the present invention is not to be limited by the particular technique used. Further, various metrics can be used in combination or as alternatives. In illustration, if timing criticality is not an issue for a particular circuit design, critical regions can be defined automatically based upon wire length.

In step 145, various ones of the candidate mobile nodes can be relocated to different sites within the gain region associated with each respective node. The relocation of nodes can be performed according to a cost function. In one embodiment, the cost function can be defined as: $C_n = (B_n + H_n) * P_n$, where $C_n$ represents the cost of relocating, or assigning, a node to a particular site with the gain region associated with the subject node, $B_n$ is a base cost for a move within the gain region corresponding to the subject node, $H_n$ is a history parameter that indicates the congestion on the current site from one or more previous iterations, and $P_n$ is a penalty parameter.

The base cost $B_n$ refers to the value returned from a composite weighted function that depends upon timing and/or wirelength results for a given node were the node to be placed on a given site. The base cost $B_n$, however, is not limited to reliance only upon timing and/or wirelength. For example, other attributes can be included and/or used independently or in combination with timing and/or wirelength. Routing congestion, power consumption, and the like also can be incorporated into the base cost $B_n$ if so desired. In any case, the base cost $B_n$ can represent the primary metric that is being optimized.

As can be seen, the cost function $C_n$ can consider other parameters relating to cell congestion and sharing through variables $H_n$ and $P_n$ respectively. As noted, the history parameter $H_n$ indicates the historical congestion of a site. In one embodiment, $H_n$ can be defined as the number of nodes assigned to the subject site in the most recent iteration of the detailed placement technique. In another embodiment, $H_n$ can be determined by taking an average of the number of nodes that have been assigned to a given site during each iteration over the last N detailed placement iterations. The penalty parameter $P_n$ imposes a penalty, i.e. increases the result of the cost function, for cases in which more than one component shares, or is assigned to, a same site. In any case, the cost function can be calculated for each of the candidate mobile nodes for different ones, or each, of the plurality of sites located in the gain region corresponding to the subject candidate mobile node.

In step 145, in determining which nodes to relocate, a node can be relocated, or reassigned, to a site that produces the most beneficial, i.e. lowest, result according to the cost function. It should be appreciated, however, that in some cases the relocation of a node to another site produces a result that is less desirable than keeping the node at its current site. In such cases, the candidate mobile node need not be reassigned to a different site, at least in the current iteration of the detailed placement technique. Accordingly, in step 150, a minimum cost placement for each of the candidate mobile nodes can be accepted.

In step 155, the costs for the various sites can be updated based upon current congestion and any penalties for sharing resources. Prior to updating the costs, the parameters $H_n$ and $P_n$ can be updated, or increased. In one embodiment, $H_n$ and $P_n$ can be increased using an increasing schedule. An increasing schedule refers to a function that can be used to update, and in this case increase, parameters. The increasing schedule, which can be compared to the inverse of a cooling schedule commonly used in simulated annealing, can increase the values of the $H_n$ and $P_n$ parameters from one iteration of the detailed placement technique to the next.

Increasing these parameters facilitates convergence of detailed placement to a legal solution. If the increasing schedule increases the parameters too rapidly, the resulting placement will be of lesser quality, although overlaps still can be removed. Increasing the costs slowly and iteratively ensures that at the end of detailed placement, each site will have the most deserving node placed on it. The embodiments described herein utilize a negotiated cost framework that balances competing objectives by applying the concept of cost negotiation. Initially, for example at the beginning of the first iteration, ignoring overlaps in steps 110 and 120 results in improving the base cost parameter $B_n$. Subsequently, the need for sacrificing the best solution for some relatively lesser critical objects to alleviate overlaps is realized. The penalties are emphasized increasingly in later iterations until, at some point, the sharing aspect of the cost function can begin to dominate. That is, the sharing eventually causes the total cost $C_n$ to appear high for location(s) despite the base cost $B_n$ being reasonable or low by comparison. This would result in the component being placed at a different site where the overall cost $C_n$ is acceptable.

Different schedules can be used depending upon desired results, the target device, the circuit design, and a variety of other parameters, where each schedule can have a different rate of increase. Further, it should be appreciated that $H_n$ and $P_n$ can be updated using the same or different schedules.

In step 160, a determination can be made as to whether the rate at which congestion is decreasing in the circuit design exceeds an expected rate of decrease. If so, the method can loop back to step 125 to continue processing. If not, the method can proceed to step 165. In one embodiment, the rate of decrease of congestion can be measured in terms of the number of overlaps in the circuit design that are identified from one iteration of the detailed placement technique to the next. The rate can be viewed or expressed as a percentage, in the actual number of overlaps, etc. In another embodiment, the rate of overlap removal, or decrease in congestion, can be viewed over more than two iterations. In that case, for example, the rate can be determined as an average rate that is calculated over N iterations of the detailed placement technique where N>2.

Continuing with step 165, where it has been determined that the rate of decrease in the level of congestion is not satisfactory, the gain region(s) can be relaxed. That is, the manner in which the gain regions are calculated can be altered to result in larger gain region(s). In one embodiment, for example, once a gain region is calculated, the length and/or width can be increased by a predetermined amount. Increasing the gain region increases the number of sites considered as potential relocation sites for a given node.

The embodiments disclosed herein provide a technique for performing a detailed placement for a circuit design. Overlaps within a circuit design can be identified. Nodes assigned to congested sites can be selectively relocated as guided by a cost function. The set of available sites to which such nodes can be moved is defined using gain region(s) that are specific to each candidate mobile node. The embodiments disclosed herein can provide a legal solution for a detailed placement of the circuit design.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising in that such terms are intended to be "open" language.

This invention can be embodied in other forms without departing from the spirit or essential attributes thereof. Accordingly, reference should be made to the following claims, rather than to the foregoing specification, as indicating the scope of the invention.

What is claimed is:

1. A computer-implemented method of placing a circuit design comprising:
   selecting at least one candidate mobile node from a plurality of overlapped nodes of the circuit design;
   determining a gain region for each candidate mobile node;
   assigning the candidate mobile node to a site within a gain region according to a cost function, wherein the gain region is associated with the candidate mobile node;
   iteratively selecting and assigning candidate mobile nodes to sites according to a measure of overlap for the circuit design, thereby generating a placement for the circuit design; and
   storing the placement for the circuit design in a machine readable storage medium.

2. The computer-implemented method of claim 1, wherein iteratively selecting and assigning candidate mobile nodes further comprises:
   evaluating a rate of change in the measure of overlap; and
   selectively adjusting the gain region according to the rate of change.

3. The computer-implemented method of claim 2, wherein iteratively selecting and assigning candidate mobile nodes further comprises stopping when the measure of overlap indicates no overlap.

4. The computer-implemented method of claim 1, wherein selecting at least one candidate mobile node further comprises selecting a node according to net-fanout.

5. The computer-implemented method of claim 1, wherein selecting at least one candidate mobile node further comprises selecting a node according to relative timing criticality.

6. The computer-implemented method of claim 1, wherein selecting at least one candidate mobile node further comprises, if at least one node of the plurality of overlapped nodes is included in a group, selecting a node according to a size of the group.

7. The computer-implemented method of claim 1, wherein assigning the candidate mobile node further comprises determining a result of the cost function for sites within the gain region corresponding to the candidate mobile node, wherein the cost function depends, at least in part, upon a measure of historical congestion for a site, wherein the measure of historical congestion is modified using an increasing schedule for consecutive iterations.

8. The computer-implemented method of claim 1, wherein assigning the candidate mobile node further comprises determining a result of the cost function for sites within the gain region corresponding to the candidate mobile node, wherein the cost function depends, at least in part, upon a penalty parameter that is imposed for sharing a site with another node, wherein the penalty parameter is modified using an increasing schedule for consecutive iterations.

9. The computer-implemented method of claim 1, wherein assigning the candidate mobile node further comprises determining a result of the cost function for sites within the gain region corresponding to the candidate mobile node, wherein the cost function depends, at least in part, upon a base cost for assigning the mobile node to another site within the gain region associated with the mobile node.

10. A computer-implemented method of placing a circuit design comprising:
    selecting at least one candidate mobile node;
    assigning the candidate mobile node to a site within a gain region associated with the candidate mobile node in accordance with a result obtained from a cost function;
    performing subsequent iterations of selecting and assigning candidate mobile nodes according to a measure of overlap for the circuit design, thereby generating a placement for the circuit design;
    selectively adjusting the gain region according to a rate of change in the measure of overlap for the subsequent iterations; and
    storing the placement for the circuit design.

11. The computer-implemented method of claim 10, wherein selectively adjusting the gain region further comprises determining a rate of change in the measure of overlap from at least three consecutive iterations of selecting and assigning the candidate mobile nodes.

12. The computer-implemented method of claim 10, wherein selecting at least one candidate mobile node further comprises selecting a node according to net-fanout.

13. The computer-implemented method of claim 10, wherein selecting at least one candidate mobile node further comprises selecting a node according to relative timing criticality.

14. The computer-implemented method of claim 10, wherein selecting at least one candidate mobile node further comprises, if at least one node of a plurality of overlapped nodes from which the candidate mobile node is selected is included in a group, selecting a node according to a size of the group.

15. A machine readable storage, having stored thereon a computer program having a plurality of code sections that, when executed by a computer, causes the computer to perform a plurality of steps, the machine readable storage comprising:
    code for selecting at least one candidate mobile node from a plurality of overlapped nodes of the circuit design;
    code for determining a gain region for each candidate mobile node;
    code for assigning the candidate mobile node to a site within the gain region according to a cost function, wherein the gain region is associated with the candidate mobile node;
    code for iteratively selecting and assigning candidate mobile nodes according to a measure of overlap for the circuit design, thereby generating a placement for the circuit design; and
    code for storing the placement for the circuit design.

16. The machine readable storage of claim 15, wherein the code for iteratively selecting and assigning candidate mobile nodes further comprises:
    code for evaluating a rate of change in the measure of overlap; and
    code for selectively adjusting the gain region according to the rate of change.

17. The machine readable storage of claim 16, wherein the code for iteratively selecting and assigning candidate mobile nodes further comprises code for stopping when the measure of overlap indicates no overlap.

18. The machine readable storage of claim 15, wherein the code for selecting at least one mobile node further comprises code for selecting a node that conforms with at least one established heuristic.

19. The method of claim 18, wherein the code for selecting at least one mobile node further comprises code for selecting a node that complies with at least one heuristic selected from the group consisting of net-fanout, timing criticality, and, if at least one node of the plurality of overlapped nodes node belongs to a group, a size of the group.

20. The machine readable storage of claim 15, wherein the code for assigning the mobile node further comprises code for determining a result of the cost function for sites within the gain region corresponding to the candidate mobile node, wherein the cost function depends, at least in part, upon one of a measure of historical congestion for a site, a penalty parameter that is imposed for sharing a site with another node, or a base cost for assigning the mobile node to another site within the gain region associated with the mobile node.

\* \* \* \* \*

UNITED STATES PATENT AND TRADEMARK OFFICE
CERTIFICATE OF CORRECTION

PATENT NO.         : 7,636,876 B1                                        Page 1 of 1
APPLICATION NO.    : 11/405902
DATED              : December 22, 2009
INVENTOR(S)        : Srinivasan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 594 days.

Signed and Sealed this

Ninth Day of November, 2010

David J. Kappos
*Director of the United States Patent and Trademark Office*